(12) United States Patent
Kotsar et al.

(10) Patent No.: US 9,570,441 B2
(45) Date of Patent: Feb. 14, 2017

(54) SEMICONDUCTOR DEVICE WITH THERMALLY GROWN OXIDE LAYER BETWEEN FIELD AND GATE ELECTRODE AND METHOD OF MANUFACTURING

(71) Applicant: Infineon Technologies AG, Neubiberg (DE)

(72) Inventors: Yulia Kotsar, Villach (AT); Sven Lanzerstorfer, Feldkirchen (AT); Robert Zink, Riegersdorf (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/745,908

(22) Filed: Jun. 22, 2015

(65) Prior Publication Data

US 2015/0380403 A1    Dec. 31, 2015

(30) Foreign Application Priority Data

Jun. 26, 2014    (DE) .................. 10 2014 108 966

(51) Int. Cl.

| | |
|---|---|
| *H01L 21/336* | (2006.01) |
| *H01L 27/088* | (2006.01) |
| *H01L 29/78* | (2006.01) |
| *H01L 29/40* | (2006.01) |
| *H01L 29/66* | (2006.01) |

(Continued)

(52) U.S. Cl.
CPC ....... *H01L 27/088* (2013.01); *H01L 21/02164* (2013.01); *H01L 21/02236* (2013.01); *H01L 21/26513* (2013.01); *H01L 21/31111* (2013.01); *H01L 21/31155* (2013.01); *H01L 21/823456* (2013.01); *H01L 29/407* (2013.01); *H01L 29/4236* (2013.01); *H01L 29/66734* (2013.01); *H01L 29/7811* (2013.01); *H01L 29/7813* (2013.01); *H01L 21/02255* (2013.01); *H01L 21/823462* (2013.01); *H01L 27/0922* (2013.01)

(58) Field of Classification Search
CPC .............. H01L 27/0922; H01L 29/7811; H01L 29/66568; H01L 21/0223; H01L 21/0217; H01L 29/404; H01L 29/0696; H01L 29/78; H01L 29/407; H01L 21/76202; H01L 21/02255; H01L 29/4236; H01L 29/66734; H01L 21/26513; H01L 29/0653; H01L 29/7813
See application file for complete search history.

(56) References Cited

U.S. PATENT DOCUMENTS 8,558,308 B1 * 10/2013 Blank ............... H01L 29/66348
                                                257/335
2004/0031987 A1    2/2004 Henninger et al.
(Continued)

*Primary Examiner* — A. Sefer
(74) *Attorney, Agent, or Firm* — Murphy, Bilak & Homiller, PLLC

(57) ABSTRACT

A first trench and a second trench, both extending from a main surface into a semiconductor layer, are filled with a first fill material. The first fill material is selectively recessed in the first trench. A mask is formed that covers the second trench and that exposes the first trench. An oxidation rate promoting material is implanted into an exposed first section of the recessed fill material in the first trench. The mask is removed. Then the first fill material is thermally oxidized, wherein on the first section an oxidation rate is at least twice as high as on non-implanted sections of the first fill material.

15 Claims, 10 Drawing Sheets

(51) Int. Cl.
    *H01L 29/423*     (2006.01)
    *H01L 21/02*     (2006.01)
    *H01L 21/311*     (2006.01)
    *H01L 21/265*     (2006.01)
    *H01L 21/3115*     (2006.01)
    *H01L 21/8234*     (2006.01)
    *H01L 27/092*     (2006.01)

(56) References Cited

U.S. PATENT DOCUMENTS

| | | |
|---|---|---|
| 2004/0161914 A1 | 8/2004 | Arnborg et al. |
| 2007/0042552 A1* | 2/2007 | Ma .................... H01L 29/0661 438/270 |
| 2008/0116511 A1* | 5/2008 | Zundel ............... H01L 29/7813 257/330 |
| 2009/0218618 A1 | 9/2009 | Blank et al. |
| 2012/0326229 A1* | 12/2012 | Poelzl ................. H01L 29/401 257/331 |
| 2013/0113038 A1* | 5/2013 | Hsieh ................ H01L 29/42376 257/330 |
| 2015/0380543 A1* | 12/2015 | Zink .................. H01L 29/7811 257/334 |

* cited by examiner

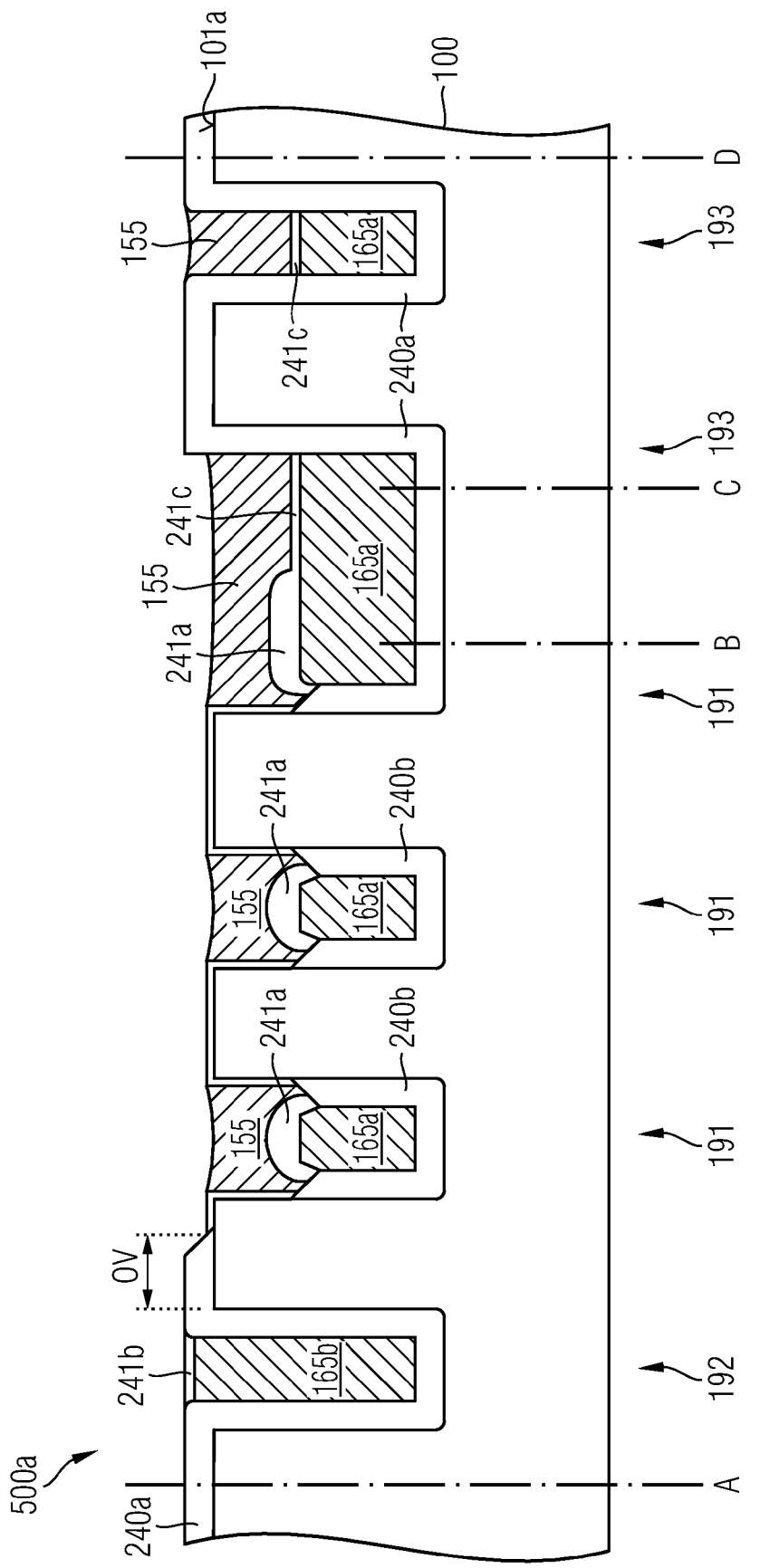

SEMICONDUCTOR DEVICE WITH THERMALLY GROWN OXIDE LAYER BETWEEN FIELD AND GATE ELECTRODE AND METHOD OF MANUFACTURING

This application claims priority to German Patent Application No. 10 2014 108 966.9 filed on 26 Jun. 2014, the content of said application incorporated herein by reference in its entirety.

BACKGROUND

In microcell power MOSFETs (metal oxide semiconductor field effect transistors) a vertical current flows through transistor cells between the source and drain electrodes placed at the front and back sides of a semiconductor body. In MOSFETs based on trench gate technology the transistor channel is formed along vertical sidewalls of trench gate structures extending from the front side into the semiconductor body. Below the gate structures, field electrodes, which may be electrically connected to the source electrode, decrease the gate to drain capacity and provide a counter charge with respect to a charge resulting from the doping in the drift zone. Smart power semiconductor devices may include signal processing circuits integrated with the transistor cells in the same semiconductor body.

It is desirable to improve reliability and to reduce manufacturing costs of power semiconductor devices.

SUMMARY

According to an embodiment, a method of manufacturing a semiconductor device includes filling a first trench and a second trench with a first fill material, wherein the first trench and the second trench extend from a main surface into a semiconductor substrate. The first fill material in the first trench is selectively recessed. A mask is formed that covers the second trench and that exposes the first trench. An oxidation rate promoting material is implanted into an exposed first section of the recessed fill material in the first trench. After removing the mask, the first fill material is thermally oxidized, wherein on the first section an oxidation rate is at least twice as high as on non-implanted sections of the first fill material.

According to another embodiment, a semiconductor device includes field electrode structures extending from a first surface into a semiconductor body. The field electrode structures include field electrodes. Gate structures extend from the first surface into the semiconductor body and include field electrodes and gate electrodes between the field electrodes and the first surface. A thin separation oxide of grown silicon oxide is on the field electrodes of the field electrode structures. A thick separation oxide of grown silicon oxide separates the gate and field electrodes of the gate structures. A vertical extension of the thick separation oxide is greater than a vertical extension of the thin separation oxide.

According to a further embodiment, an electronic circuit includes a semiconductor device including field electrode structures that extend from a first surface into a semiconductor body. The field electrode structures include field electrodes. Gate structures extend from the first surface into the semiconductor body and include field electrodes and gate electrodes between the field electrodes and the first surface. A thin separation oxide of grown silicon oxide is on the field electrodes of the field electrode structures. A thick separation oxide of grown silicon oxide separates the gate and field electrodes of the gate structures. A vertical extension of the thick separation oxide is greater than a vertical extension of the thin separation oxide.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 4B is a schematic cross-sectional view of a portion of a semiconductor device manufactured in a process using the masks of FIG. 4A.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having," "containing," "including, "comprising" and the like are open, and the terms indicate the presence of stated structures, elements or features but do not preclude additional elements or features. The articles "a," "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
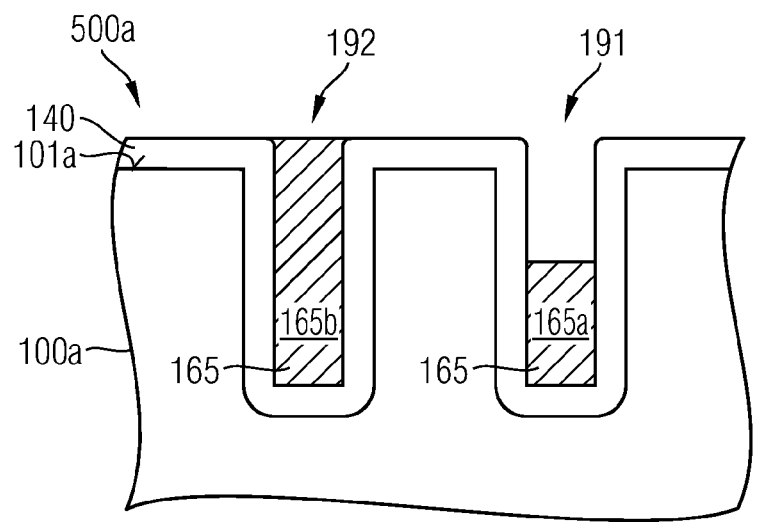
FIG. 1A is a schematic cross-sectional view of a portion of a semiconductor substrate for illustrating a method of manufacturing a semiconductor device according to an embodiment, after recessing a first fill material in a first trench.

FIG. 1A shows a semiconductor substrate 500a consisting of or containing a semiconductor layer 100a of a single-crystalline semiconductor material. The semiconductor substrate 500a may be a semiconductor wafer from which a plurality of identical semiconductor dies is obtained. The single crystalline semiconductor material of the semiconductor layer 100a may be silicon (Si), silicon carbide (SiC), germanium (Ge), a silicon germanium crystal (SiGe), gallium nitride (GaN), gallium arsenide (GaAs) or any other $A_{III}B_V$ semiconductor, by way of example.

A direction perpendicular to a main surface 101a of the semiconductor layer 100a defines a vertical direction and directions orthogonal to the vertical direction are horizontal directions.

From the main surface 101a, first trenches 191 and second trenches 192 extend into the semiconductor layer 100a. A vertical extension of the first and second trenches 191, 192 may be in a range from 1 to 10 µm, for example from 3 to 5 µm A horizontal width of the trenches 191, 192 may be in a range from 0.2 to 2 µm, for example in a range from 0.8 to 1.0 µm. The first and second trenches 191, 192 are stripe-shaped trenches or portions of stripe-shaped trenches extending in a horizontal direction orthogonal to the cross-sectional plan. The first and second trenches 191, 192 may have the same cross-sectional area. According to other embodiments, the second trenches 192 may be wider and deeper than the first trenches 191. For example, a width of the second trenches 192 exceeds a width of the first trenches 191 by 5%.

A conformal field dielectric layer 240 of uniform layer thickness lines the first and second trenches 191, 192 and covers the main surface 101a. The field dielectric layer 240 may consist of or include a thermally grown semiconductor oxide, for example a thermally grown silicon oxide in case the semiconductor layer 100a is single crystalline silicon. According to another embodiment, the field dielectric layer 240 may be a deposited semiconductor oxide, for example deposited silicon oxide such as silicon oxide obtained by using TEOS (tetraethyl orthosilicate) as precursor material. According to other embodiments, the field dielectric layer 240 may include a silicon nitride layer, a silicon oxide layer or another dielectric material. A layer thickness of the field dielectric layer 240 may be in a range from 50 to 300 nm, for example in a range from 200 to 250 nm. A first fill material 165 fills the space between portions of the field dielectric layer 240 lining the first and second trenches 191, 192. The first fill material 165 consists of or contains heavily doped polycrystalline silicon.

A mask layer may be deposited and patterned by a photolithographic method to obtain an etch mask that covers the second trenches 192 and that exposes the first trenches 191. Using the etch mask first fill portions 165a of the first fill material 165 in the first trenches 191 are selectively recessed with respect to second fill portions 165b of the first fill material 165 in the second trenches 192.

According to an embodiment, the etch mask for recessing the first fill material 165 may be used as an implant mask 410 in the following. According to other embodiments, the implant mask 410 is another mask replacing the etch mask. According to a further embodiment, the implant mask 410 may be formed by modifying the etch mask. An oxidation rate promoting material 411 is implanted into portions of the field dielectric layer 240 and into portions of the recessed first fill portions 165a in the first trenches 191 exposed by the implant mask 410. The oxidation rate promoting material 411 may be or may contain arsenic ions. The implant is performed at comparatively high dose and low energy.

Figure 1B:
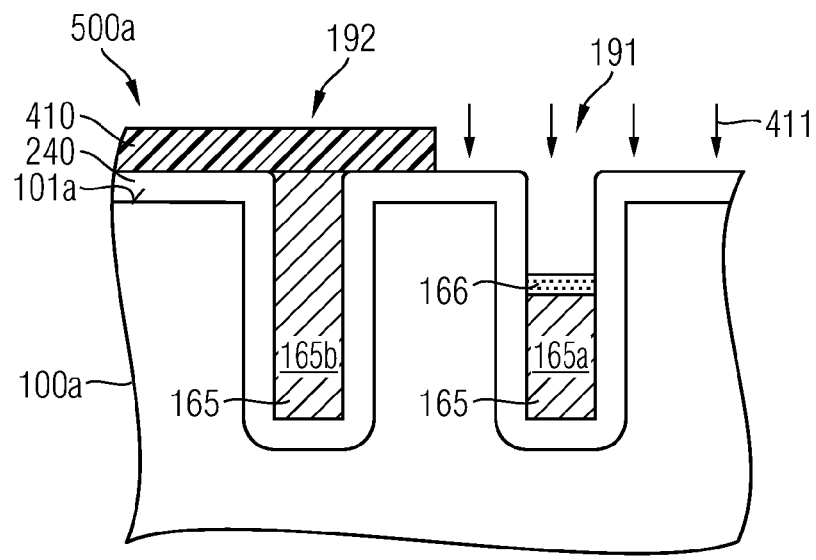
FIG. 1B is a schematic cross-sectional view of the semiconductor substrate portion of FIG. 1A after implanting an oxidation rate promoting material into a first section of the recessed fill material in the first trench.
Figure 1C:
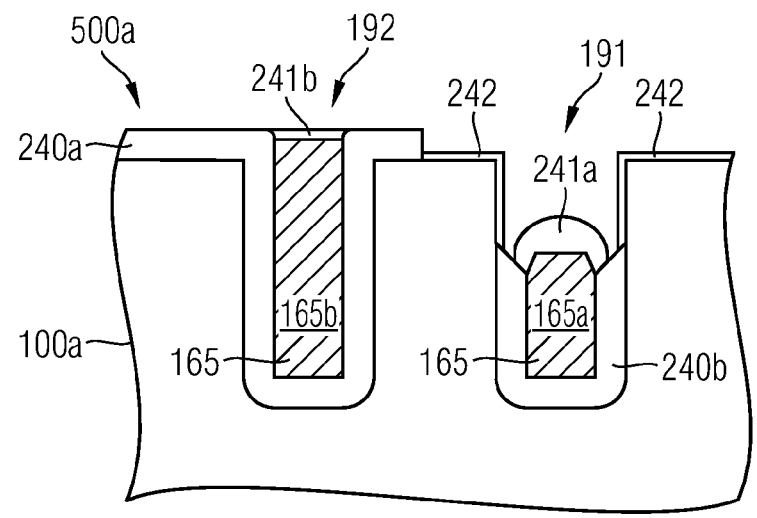
FIG. 1C is a schematic cross-sectional view of the semiconductor substrate portion of FIG. 1B after a thermal oxidation of exposed semiconductor material.

FIG. 1B shows the implant mask 410 that exposes the first fill portions 165a in the first trenches 191 and that covers the second fill portions 165b in the second trenches 192 such that the oxidation rate promoting material 411 is selectively implanted into a first section 166 of the first fill portions 165a, whereas no oxidation rate promoting material is implanted into the second fill portions 165b.

Then the implant mask 410 or another mask replacing the implant mask 410 may be used as an etch mask for selectively removing an exposed portion of the field dielectric layer 240, wherein sections of the semiconductor layer 100a are exposed. After removal of the implant mask 410 the semiconductor substrate 500a may be subjected to a heat treatment in an oxygen containing ambient, wherein a thermal semiconductor oxide is formed on exposed semiconducting surfaces. An oxidation growth rate is higher on the implanted first section 166 of the first fill material 165 than on semiconducting material without implanted oxidation rate promoting material 411, e.g., on the semiconductor layer 100a and on the second fill portions 165b.

FIG. 10 shows a first portion 240a of a resulting field dielectric completely lining the second trenches 192. A second portion 240b lines bottom portions of the first trenches 191. A thin gate dielectric 242 is grown on the single crystalline surface in a portion of the semiconductor layer 100a, where the field dielectric layer 240 has been removed. The thin gate dielectric 242 lines top portions of the first trenches 191. A thick separation oxide 241a grows on the first fill portions 165a, whereas only a thin separation oxide 241b grows on the second fill portions 165b in the second trenches 192.

By masking the implant of the oxidation rate promoting material 411, the implant mask 410 of FIG. 1B suppresses the formation of a thick oxide on the second fill portions 165b in the second trenches 192. The topology and above as well as the surface in a region containing the second trenches 192 remain flat. The flat surface simplifies subsequent processing. For example, when a second fill material is deposited and recessed to fill the upper portions of the first trenches 191, no ancillary spacers are formed above the second trenches 192.

FIGS. 2A to 2F illustrate a method according to a comparative example for discussing effects of the method illustrated in FIGS. 1A to 10.

A conformal field dielectric layer 240 is formed on a semiconductor layer 100a of a semiconductor substrate 501a including first trenches 191 and second trenches 192. A first fill material 165 is deposited and selectively recessed in the first trenches 191.

Figure 2A:
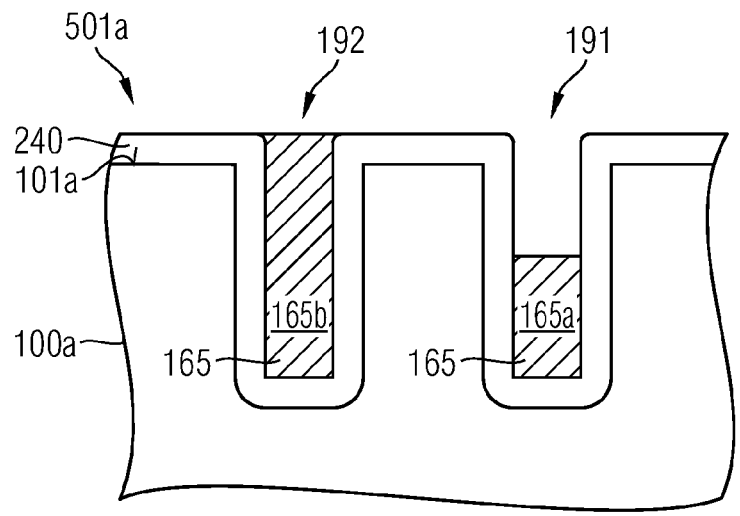
FIG. 2A is a schematic cross-sectional view of a portion of a semiconductor substrate for illustrating a method of manufacturing a semiconductor device according to another embodiment, after recessing the first fill material in the first trench.

FIG. 2A shows the first and second trenches 191, 192 extending from a main surface 101a into the semiconductor layer 100a. The field dielectric layer 240 covers the main surface 101a and lines the first trenches 191 and the second trenches 192. First fill portions 165a of the first fill material 165 fill bottom portions of the first trenches 191. Second fill portions 165b of the first fill material completely fill the second trenches 192.

An oxidation rate promoting material 411 is implanted into exposed portions of the field dielectric layer 240 and into exposed surfaces of the first fill material 165 in an implant process without implant mask.

Figure 2B:
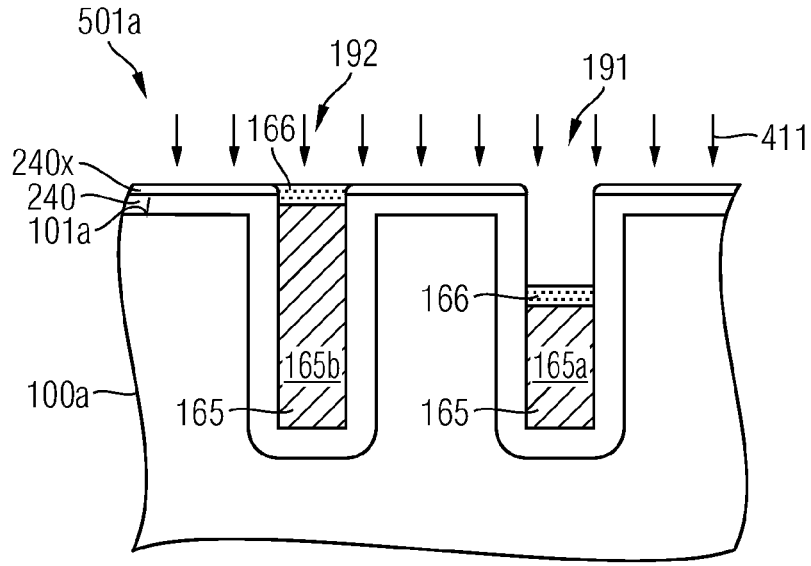
FIG. 2B is a schematic cross-sectional view of the semiconductor substrate portion of FIG. 2A after implanting an oxidation rate promoting material into the first fill material.

FIG. 2B shows implant portions 240x of the field dielectric layer 240. The thickness of the implant portions 240x may be in a range from about 5 to 50 nm. Implanted first sections 166 of the first fill material 165 contain the oxidation rate promoting material 411.

A mask layer is deposited and patterned by photolithography to form an etch mask 405 for patterning the field dielectric layer 240.

Figure 2C:
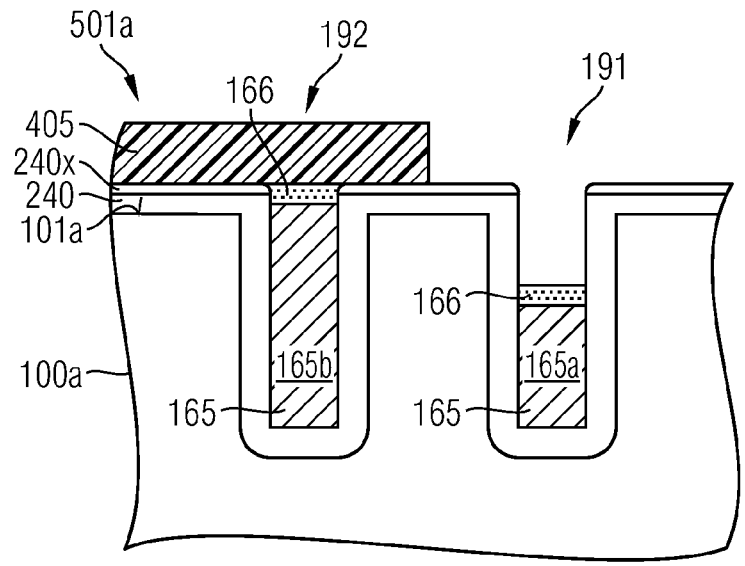
FIG. 2C is a schematic cross-sectional view of the semiconductor substrate portion of FIG. 2B after forming a first mask.

FIG. 2C shows the etch mask 405 covering a region of the main surface 101a including the second trenches 192 and exposing a region of the main surface 101a including the first trenches 191.

Using the etch mask 405 an exposed portion of the field dielectric layer 240 is removed. After patterning the field dielectric layer 240 the first mask 405 is removed, wherein the implanted first sections 166 of the first fill material 165 are exposed.

Figure 2D:
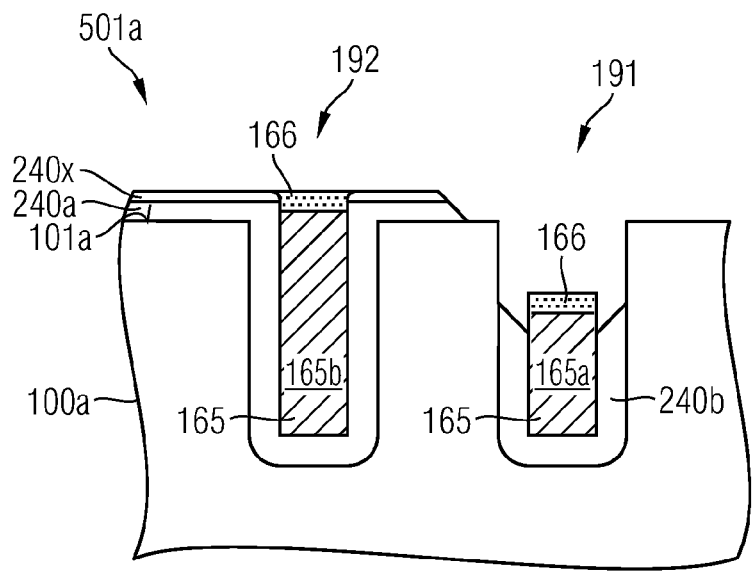
FIG. 2D is a schematic cross-sectional view of the semiconductor substrate portion of FIG. 2C after etching a field dielectric layer using the first mask.

FIG. 2D shows the patterned field dielectric 240a, 240b with a first portion 240a covering a first region of the main surface 101a and lining the second trenches 192. A second portion 240b lines bottom portions of the first trenches 191. The oxidation rate promoting material 411 also damages the material of the field dielectric layer 240 such that the etch results in a smooth edge of the first portion 240a of the field dielectric on the main surface 101a. An HFB (buffered aqueous solution of hydrogen fluoride) etch that lasts for several minutes removes the implanted portions 240x to avoid an undesired outdiffusion of the oxidation rate promoting material 411 at a later process stage.

The semiconductor substrate 500a is subjected to a heat treatment in an oxygen-containing atmosphere, wherein the oxidation rate promoting material promotes the oxidation of the semiconductor material on the exposed surfaces of the first sections 166 of the first fill material 165.

Figure 2E:
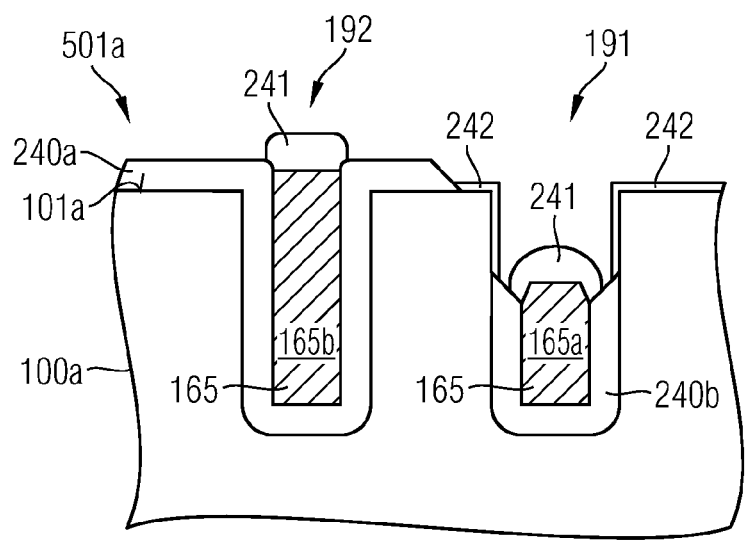
FIG. 2E is a schematic cross-sectional view of the semiconductor substrate portion of FIG. 2D after thermal oxidation of exposed semiconductor material.
Figure 2F:
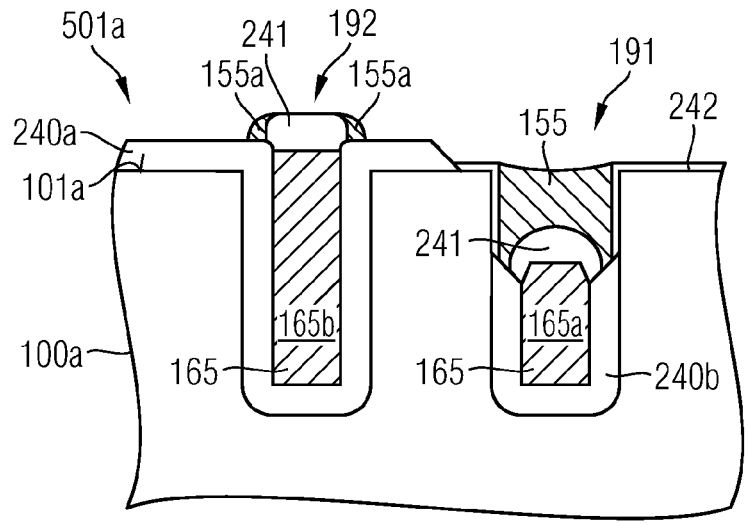
FIG. 2F is a schematic cross-sectional view of the semiconductor substrate portion of FIG. 2E after depositing and recessing a second fill material.

FIG. 2E shows separation oxides 241 grown at high oxidation rate on the first and second fill portions 165a, 165b. A thin gate dielectric 242 is grown on exposed portions of the semiconductor layer 100a. The separation oxide 241 grown on the second fill portion 165b protrudes from an exposed edge of the field dielectric 240a by several nanometers, for example by about 150 nm.

A second fill material 155 is deposited and recessed such that the second fill material 155 is removed from portions outside the first trenches 191. When the second fill material 155 is deposited, the vertical extension of the deposited second fill material is greater in areas around steps and protrusions in the underlying surface, e.g., around the protrusions formed by the separation oxide 241 above the second trenches 192. The recess of the second fill material 155 is mainly anisotropic with a high removal rate along the vertical direction. As a result, ancillary spacers 155a of the second fill material 155 may be formed along the vertical sidewalls of the separation oxides 241 above the second trenches 192. Increasing the process time for reliably removing the ancillary spacers 155a also further recesses the portions of the second fill material 155 forming the gate electrode, such that a distance between the main surface 101a and the second fill material 155 in the first trenches 191 may become too large for shallow source implants.

FIGS. 3A to 3F refer to an embodiment including an oxide damage implant. The description of details described with reference to FIGS. 1A to 10 is omitted.

Using a first mask as an etch mask, first trenches 191 and second trenches 192 are formed that extend in a cell area 610 from a main surface 101a into a semiconductor layer 100a of a semiconductor substrate 500a. A conformal field dielectric layer 240 is formed, for example by growing a semiconductor oxide on the semiconductor layer 100a.

Figure 3A:
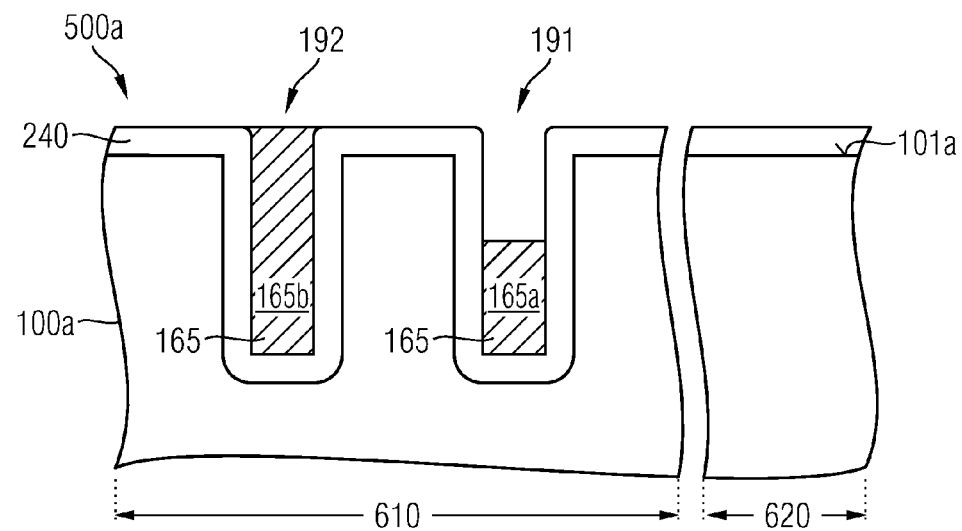
FIG. 3A is a schematic cross-sectional view of a portion of a semiconductor substrate for illustrating a method of manufacturing a semiconductor device according to an embodiment including an oxide damage implant, after recessing a first fill material in a first trench.

FIG. 3A shows the conformal field dielectric layer 240 formed on the main surface 101a in the cell area 610 and in a logic area 620. The logic area 620 may be devoid of any patterned structures such as gate electrodes at this stage. The conformal field dielectric layer 240 lines the first trenches 191 and the second trenches 192. A first fill material 165, for example heavily doped polycrystalline silicon, is deposited and locally recessed using a second mask as an etch mask. The second mask may be removed after the recess.

FIG. 3A shows locally recessed first fill portions 165a of the first fill material 165 in the first trenches 191 and unrecessed second fill portions 165b in the second trenches 192. The field dielectric layer 240 lines at uniform thickness the first and second trenches 191, 192 and covers the main surface 101a in both the cell area 610 and the logic area 620.

An oxide damage material 412, for example argon (Ar) atoms may be implanted at an implant energy of about 40 keV and an implant dose of about 4E+13 cm$^{-2}$.

Figure 3B:
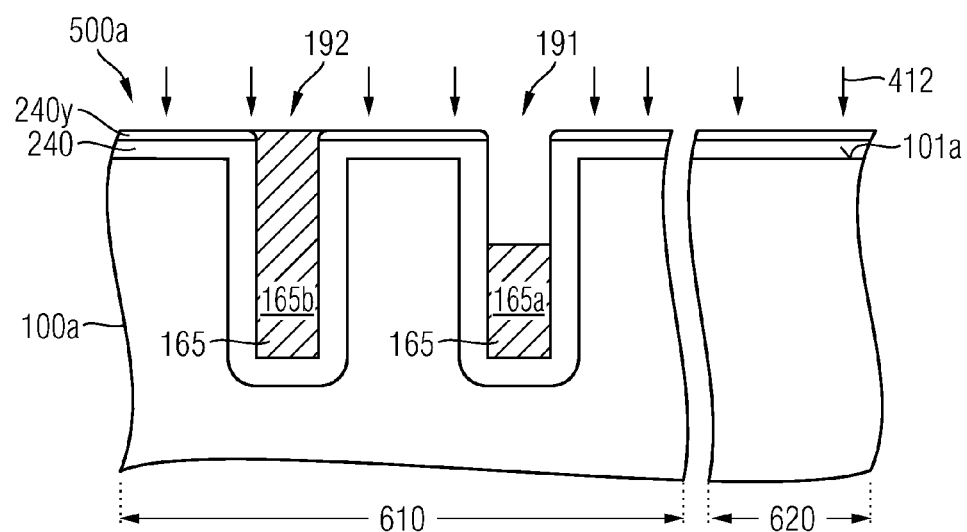
FIG. 3B is a schematic cross-sectional view of the semiconductor substrate portion of FIG. 3A after the oxide damage implant.

FIG. 3B shows an implant portion 240y of the field dielectric layer 240. The implant portion 240y contains the oxide damage material 412, which does not or only to a very low degree affect an oxidation rate of the first fill material 165.

A third mask layer is deposited and patterned by photolithography to form a third mask 430. The material of the third mask 430, for example a photoresist, can be recessed or etched with high selectivity against the material of the field dielectric layer 240. An oxidation rate promoting material 411, for example arsenic (As) atoms, are implanted, wherein the third mask 430 is effective as an implant mask and shields a covered region against the implant of the oxidation rate promoting material 411.

Figure 3C:
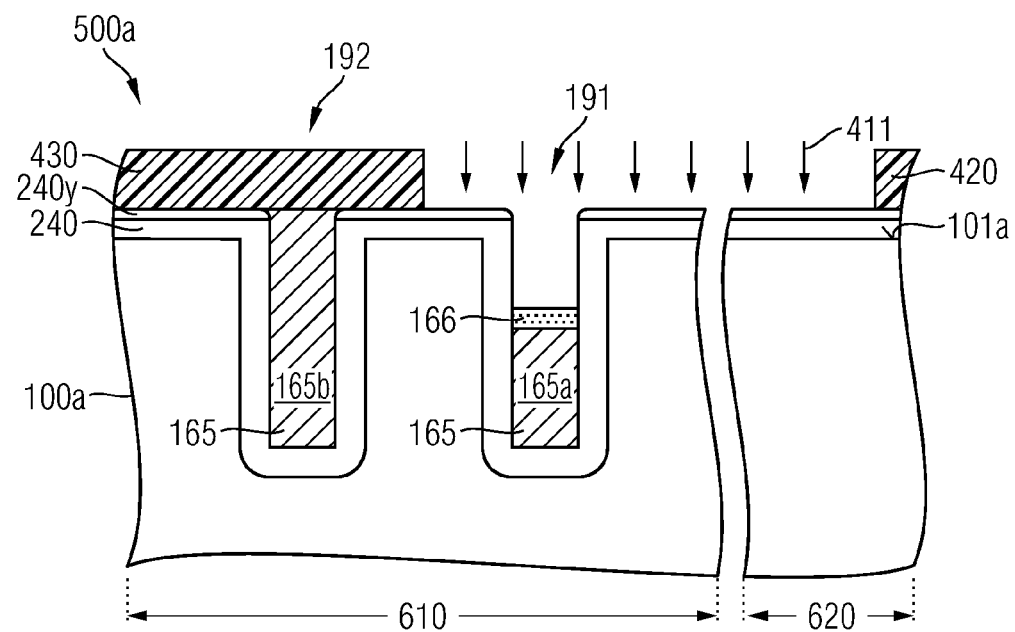
FIG. 3C is a schematic cross-sectional view of the semiconductor substrate portion of FIG. 3B after implanting an oxidation rate promoting material.

FIG. 3C shows the third mask 430 covering a first region in the cell area 610 containing the second trenches 192 and exposing, in the cell area 610, a second region containing the first trenches 191. The third mask 430 may also cover further regions in the logic area 620. Implanted first sections 166 of the first fill portions 165a in the first trenches 191 contain the oxidation rate promoting material 411. No oxidation rate promoting material 411 is implanted into the second fill portions 165b in the second trenches 192, which are shielded against the implant by the second mask 420.

The field dielectric layer 240 may be patterned using the third mask 430 or another mask replacing the third mask 430 as an etch mask. The third mask 430 may be removed after patterning the field dielectric layer 240. An HFB etch for removing remnants including arsenic atoms may follow. Since the patterning of the field dielectric layer 240 removes all portions of the field dielectric layer 240 containing arsenic atoms, which are effective as undesired dopant in the semiconductor material of the semiconductor layer 100a, when they diffuse out from the field dielectric layer 240 into the semiconductor layer 100a during further processing, the HFB time may be shortened to not more than approximately one minute without adversely affecting the device characteristics.

Figure 3D:
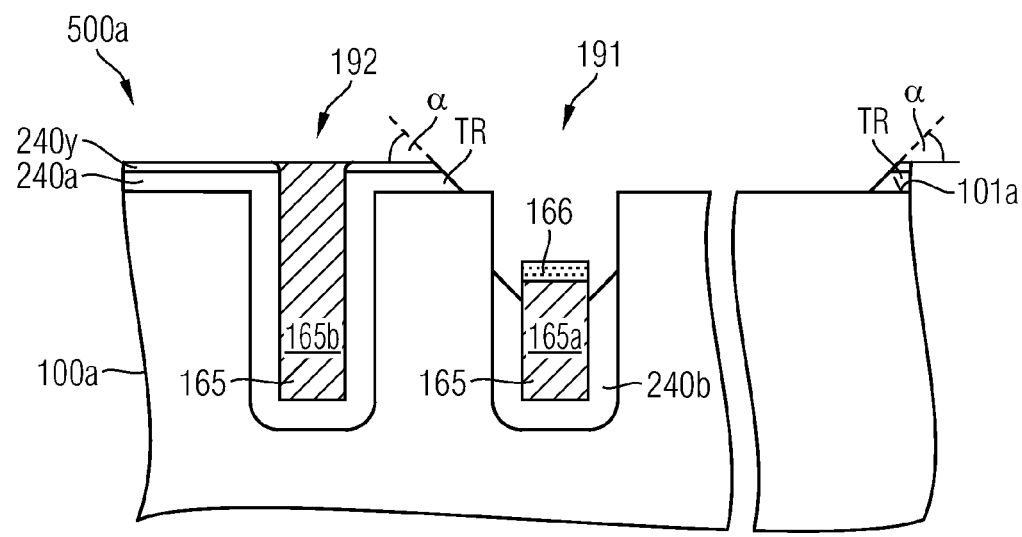
FIG. 3D is a schematic cross-sectional view of the semiconductor substrate portion of FIG. 3C after a masked etch of a field dielectric layer.

FIG. 3D shows the patterned field dielectric with first portions 240a covering the main surface 101a and lining the second trenches 192 in a first region and with second portions 240b separating the first fill portions 165a from the semiconductor layer 100a in a second region. The damage implant in the implant portion 240y containing the argon atoms results in smooth edges of the first portions 240a on the main surface 101a. For example, transitions TR at the edges of the first portions 240a may have a slope angle α with respect to the main surface 101a in a range from 30 degree to 40 degree.

According to the illustrated embodiment, the implant of the oxidation rate promoting material 411 and the etch of the field dielectric layer 240 use the same mask such that the oxidation rate promoting material is only formed where the field dielectric is removed. The oxide damaging implant is performed before the shared mask is applied. According to other embodiments, the oxidation rate promoting implant may share the same mask as the recess of the first fill material 165 such that the oxidation promoting material is only implanted where the first fill material 165 is recessed. The oxide damaging implant may be performed maskless, e.g., before the shared mask or the mask for etching the field dielectric layer 240 is applied.

A thermal oxidation process is performed, wherein an oxidation rate in semiconductor materials containing the oxidation rate promoting material 411 is higher, e.g., at least twice or at least four times as high as in semiconductor materials without oxidation rate promoting material.

Figure 3E:
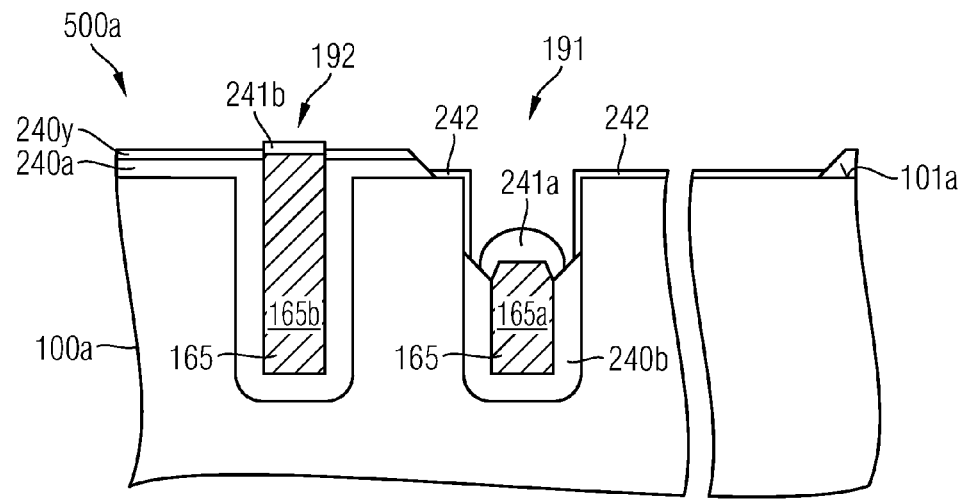
FIG. 3E is a schematic cross-sectional view of the semiconductor substrate portion of FIG. 3D after thermal oxidation of exposed semiconductor material.

As illustrated in FIG. 3E, thick separation oxides 241a are exclusively formed on the recessed first fill portions 165a, whereas only thin separation oxides 241b are formed on the second fill portions 165b. The oxidation process further forms a thin gate dielectric 242 on exposed portions of the semiconductor layer 100a. A second fill material 165 is deposited and recessed.

FIG. 3E shows the recessed second fill material 165 in the upper portions of the first trenches 191. Since no high and steep edges and transitions are formed on the front side, no ancillary spacers are formed as a side effect. Gate electrodes 158 of lateral transistors may be formed in the logic area 620. Further, heavily doped source zones 110 and source/drain zones 111 of a first conductivity type as well as body and termination zones 115, 116 of a second, complementary conductivity type may be formed in the semiconductor layer 100a, which may be of the n-conductive in the rest.

Figure 3F:
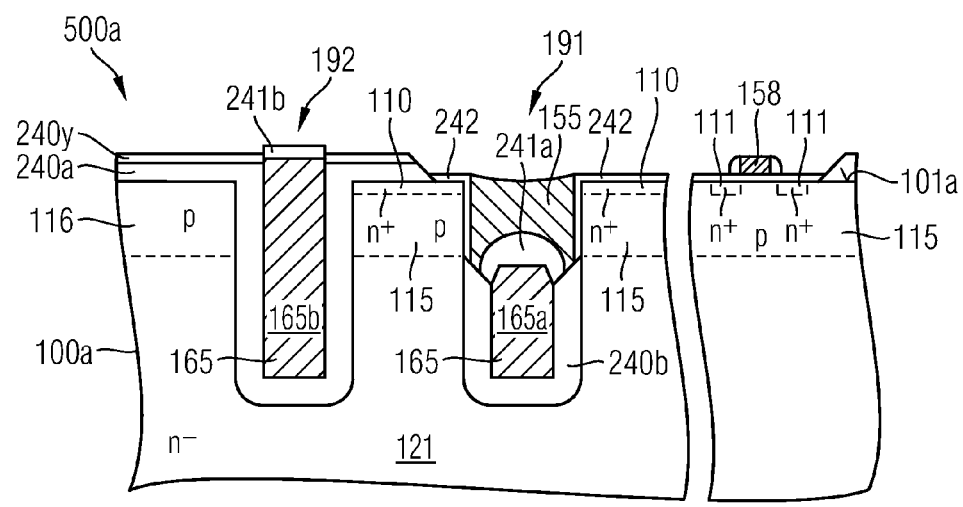
FIG. 3F is a schematic cross-sectional view of the semiconductor substrate portion of FIG. 3E after depositing and recessing a second fill material.

FIG. 3F refers to a device including DMOS power transistor cells with p-conductive body regions, n-conductive source zones 110 and an n-conductive drift region 121. Pn-junctions formed between the body regions 115 and the drift region 121 may be adjusted to the transition between the gate dielectric 242 and the second portions 240b of the field dielectric. Formation of the source zones 110 may be combined with the formation of source/drain zones 110 of lateral transistor cells in the logic area 620. Third portions 240c of the field dielectric in the logic area 620 may form field dielectrics of high-voltage transistors, by way of example.

The masked implant of the oxidation rate promoting material 411 avoids ancillary spacers above the second trenches 192 and reduces the residence time for the HFB etch significantly with respect to the comparative example illustrated in FIGS. 2A to 2F. The shorter HFB avoids the formation of steps at edges of the first portions 240b of the field dielectric and also the formation of further ancillary spacers, which may be formed during the recess of the second fill material 155 along such edges.

Figure 4A:
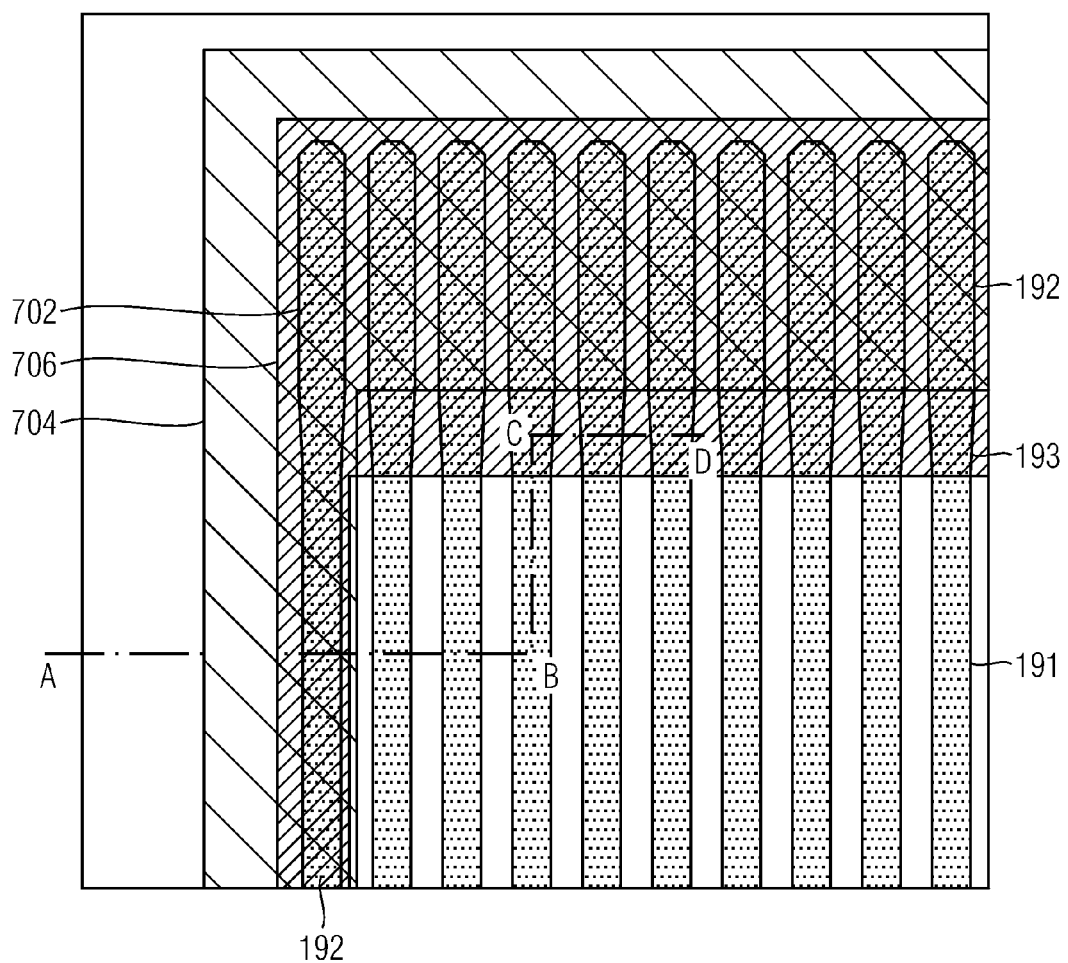
FIG. 4A is a schematic illustration of masks used in the method of FIGS. 3A to 3F.

FIG. 4A shows masks used in the method as described in FIGS. 3A to 3F. A first mask 702 exposes regularly spaced parallel stripes, portions of which form the first and second trenches 191, 192. A second mask 704 exposes a first region where the first fill material is recessed and covers a second region, where the first fill material is not recessed. Portions of the stripe-shaped trenches covered by the second mask 704 are second trenches 192 and portions of the stripe shaped trenches exposed by the third mask 706 are first trenches 191. A third mask 706 covers the first portions of the field dielectric layer and exposes regions where a thin gate dielectric replaces the field dielectric layer. An overlap of the third mask 706 with respect to termination trenches at the edges of a field of parallel stripe-shaped trenches is at least 250 nm such that the field dielectric transitions or edges are reliably spaced from the trench edges. Either the second or the third mask 704, 706 may be used as the implant mask for the oxidation rate promoting implant.

FIG. 4B shows a vertical cross-section along line A-B-C-D in FIG. 4A. As shown on the right hand side, in transition trenches 193 between first and second trenches 191, 192, which form portions of the same stripe-shaped trench, only thin separation oxides 241c are formed where both thick field dielectrics 240a are formed and the first fill portions 195a are recessed. When the third mask 706 for etching the field dielectric layer also shields the transition trench 193 against the implant of the oxidation rate promoting material, only the thin separation oxides 241c are formed between the first fill material 165 and the second fill material 155 in the transition trenches 193. With respect to breakthrough reliability a possible negative impact of the thin separation oxides 241c may be at least partly compensated by the contiguous thick field dielectric along the trench sidewalls.

Figure 5:
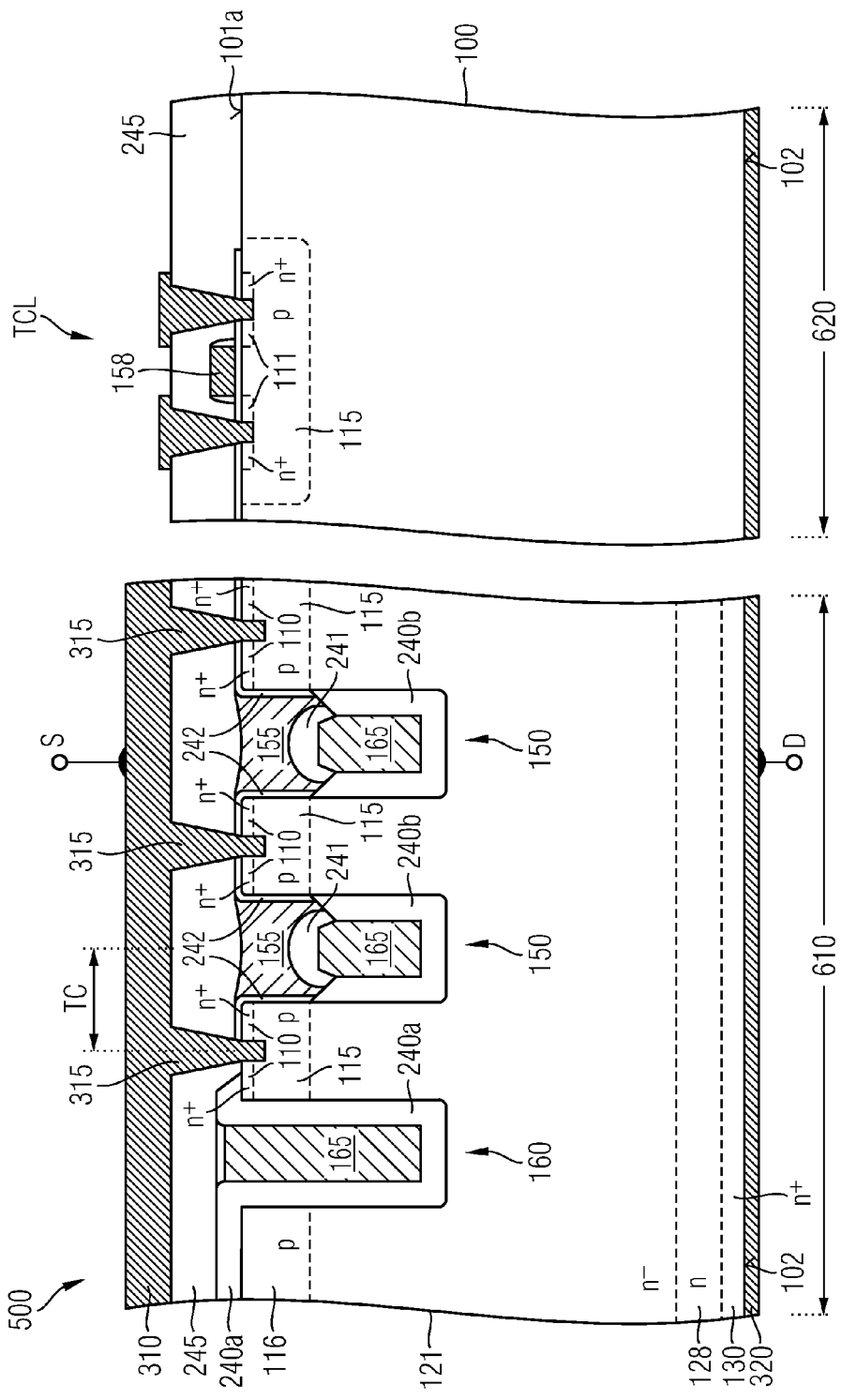
FIG. 5 is a schematic cross-sectional view of a portion of a semiconductor device in accordance with another embodiment.

FIG. 5 refers to a semiconductor device 500 including transistor cells TC and manufactured by the method as described with regard to the previous Figures. The semiconductor device 500 may be or may include an IGFET (insulated gate field effect transistor), for example a MOSFET (metal oxide semiconductor FET) in the usual meaning including FETs with metal gates as well as FETs with non-metal gates, by way of example. Another embodiment may refer to an IGBT (insulated gate bipolar transistor). The semiconductor device 500 may integrate further signal processing circuits, e.g., logic circuits, driver circuits, sensor circuits and control circuits in a logic area 620 separated from a cell area 610 that includes the transistor cells TC. The semiconductor device 500 may integrate transistors in DMOS(diffusion metal oxide semiconductor) technology and CMOS(complementary metal-oxide semiconductor) technology and may be a smart FET, e.g. a smart low-side or high-side switch or a smart power IC (integrated circuit), e.g. a multi-channel switch or a CAN (controller area network) transceiver.

The semiconductor device 500 is based on a semiconductor body 100 from a single-crystalline semiconductor material such as silicon (Si), silicon carbide (SiC), germanium (Ge), a silicon germanium crystal (SiGe), gallium nitride (GaN), gallium arsenide (GaAs) or any other $A_{III}B_V$ semiconductor.

The semiconductor body 100 has a first surface 101 which may be approximately planar or which may be defined by a plane spanned by coplanar surface sections as well as a mainly planar second surface 102 parallel to the first surface 101. A distance between the first and second surfaces 101, 102 is selected to achieve a specified voltage blocking capability of the transistor cells TC and may be at least 40 μm, by way of example. In a plane perpendicular to the cross-sectional plane, the semiconductor body 100 may have a rectangular shape with an edge length in the range of several millimeters.

The semiconductor body 100 includes a drift region 121 of a first conductivity type as well as a drain layer 130 of the first conductivity type between the drift region 121 and the second surface 102.

A dopant concentration in the drift region 121 may gradually or in steps increase or decrease with increasing distance to the first surface 101 at least in portions of its vertical extension. According to other embodiments, the dopant concentration in the drift region 121 may be approximately uniform. A mean dopant concentration in the drift region 121 may be between $5E12$ cm$^{-3}$ and $1E15$ cm$^{-3}$, for example in a range from $5E13$ cm$^{-3}$ to $5E14$ cm$^{-3}$. The drift region 121 may include further doped zones of the first and/or second conductivity type.

A dopant concentration in the drain layer 130 along the second surface 102 is sufficiently high to form an ohmic contact with a metal directly adjoining the second surface 102. In case the semiconductor body 100 is based on silicon Si, along the second surface 102 a dopant concentration in an n-conductive drain layer 130 may be at least $1E18$ cm$^{-3}$, for example at least $5E19$ cm$^{-3}$ and in a p-conductive drain layer 130 at least $1E16$ cm$^{-3}$, for example at least $5E17$ cm$^{-3}$.

A field stop layer 128 of the first conductivity type may separate the drift region 121 from the drain layer 130, wherein a mean dopant concentration in the field stop layer 128 may be at least five times as high as a mean impurity concentration in the drift region 121 and at most one-fifth of a maximum impurity concentration in the drain layer 130.

Field electrode structures 160 and gate structures 150 extend from the first surface 101 into the semiconductor body 100 in the cell area 610. The gate structures 150 include gate electrodes 155 in top portions oriented to the first surface 101 and field electrodes 165 in bottom portions oriented to the second surface 102. The field electrode structures 160 include field electrodes 165 but do not contain gate electrodes 155. Thick field dielectrics 240a, 240b separate the field electrodes 165 from the surrounding semiconductor material of the semiconductor body 100. A thin gate dielectric 242 separates the gate electrodes 155 from the semiconductor material of the semiconductor body 100.

A thick separation oxide 241a separates the gate electrodes 155 from the field electrodes 165. A thin separation oxide 241b from the same material as the thick separation oxide 241a may be formed on a surface of the field electrodes 165 in the field electrode structures 160. The separation oxides 341a, 241b are silicon oxides thermally grown on a polycrystalline substrate. A vertical extension of the thick separation oxide 241a exceeds at least twice the vertical extension of the thin separation oxide 241b. According to an embodiment, the maximum vertical extension of the thick separation oxide 241a is at least five times as large as the vertical extension of the thin separation oxide 241b.

The field dielectrics 240a, 240b may be conformal layers of grown semiconductor oxide, for example grown silicon oxide in case the semiconductor body 100 is made from single crystalline silicon. According to other embodiments, the field dielectrics 240a, 240b may include a silicon nitride layer or a silicon oxide resulting from a deposition process.

The gate dielectric 242 is thermally grown semiconductor oxide, for example thermally grown silicon oxide. The separation oxide 241 is a semiconductor oxide thermally grown on the material of the field electrodes 165. Gate and field electrodes 155, 165 consist of or contain heavily doped polycrystalline silicon.

In mesa portions of the semiconductor body 100 between the gate structures 150 and field electrode structures 160, doped source zones 110 of the first conductivity type may directly adjoin the first surface 101. Body zones 115 of the second conductivity type form first pn-junctions with the source zones 110 and second pn-junctions with the drift region 121. The body zones 115 separate the source zones 110 from the drift region 121. Outside the semiconductor body 100 an interlayer dielectric 245 separates the gate electrodes 155 from a first load electrode 310. The interlayer dielectric 245 may include one or more dielectric layers from silicon oxide, silicon nitride, silicon oxynitride, doped or undoped silicon glass, for example BSG (boron silicate glass), PSG (phosphorus silicate glass) or BPSG (boron phosphorus silicate glass), by way of example.

The interlayer dielectric 245 is a homogeneous or layered conformal structure with uniform cross-section above the gate structures 150 and above the field electrode structures 160.

The first load electrode 310 may form or may be electrically coupled or connected to a first load terminal, for example the source terminal S in case the transistor cells TC form an n-channel IGFET. Contact structures 315 extend through the interlayer dielectric 245 and electrically connect the first load electrode 310 with the body zones 115 and the source zones 110.

A second load electrode 320, which directly adjoins the second surface 102 and the drain layer 130, may form or may be electrically connected to a second load terminal, which may be the drain terminal D in case the transistor cells TC form an n-channel IGFET.

Each of the first and second load electrodes 310, 320 may consist of or contain, as main constituent(s), aluminum (Al), copper (Cu), or alloys of aluminum or copper, for example AlSi, AlCu or AlSiCu. According to other embodiments, at least one of the first and second load electrodes 310, 320 may contain, as main constituent(s), nickel (Ni), titanium (Ti), tungsten (W), tantalum (Ta), vanadium (V), silver (Ag), gold (Au), platinum (Pt), and/or palladium (Pd). For example, at least one of the first and second load electrodes 310, 320 may include two or more sub-layers, wherein each sub-layer contains one or more of Ni, Ti, V, Ag, Au, Pt, W, and Pd as main constituent(s), e.g., a silicide, a nitride and/or an alloy.

In the logic area 620 the semiconductor device 500 may include a signal processing circuit, for example a logic circuit, a sense circuit, a control circuit, or a driver circuit such as a gate driver circuit. The signal processing circuit may include lateral transistors TCL with planar gate electrodes 158 and shallow source/drain zones 111, which may be formed contemporaneously with the source zones 110 in the cell area 610, wherein the source zones 110 and the source/drain zones 111 may have the same vertical extension. The logic area 620 may further include high voltage transistors including further portions of the field dielectric used for decoupling low-doped lateral drain extensions.

Since no thick separation oxide is formed in the vertical projection of the field electrode structures 160, no conductive spacer remnants that may result from the formation of the gate electrodes 155 and that may adversely affect device reliability appear in the interlayer dielectric 245.

Figure 6A:
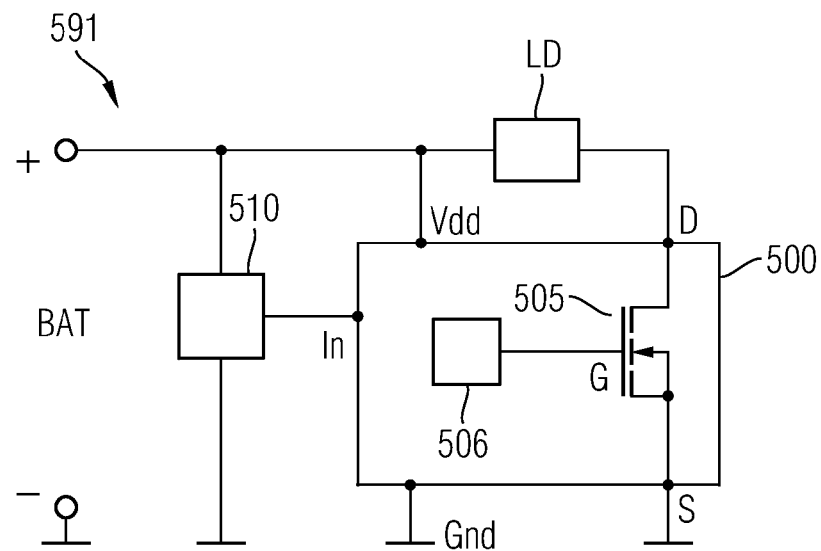
FIG. 6A is a schematic circuit diagram of an electronic circuit including a smart FET (field effect transistor) according to an embodiment.

FIG. 6A refers to an electronic circuit 591 including a semiconductor device 500 as described in the previous figures. The semiconductor device 500 may be a smart FET usable as a low-side switch and including a power FET 505 and a signal processing circuit 506. A drain terminal D is electrically connected to a drain electrode of the power FET 505 and may be connected to a load LD which may be a motor winding, a coil or a transformer winding, by way of example. The load LD is electrically arranged in series between the anode of a battery BAT and the drain terminal D. A source terminal S of the semiconductor device 500 is electrically connected to a source electrode of the power FET 505 and may be connected to a cathode of the battery BAT. Further power terminals Vdd, Gnd may provide the supply voltage for the internal signal processing circuit 506. A gate control circuit 510 may be electrically connected to an input terminal IN and may supply a signal for controlling the switching cycle of the semiconductor device 500.

The power FET 505 includes a microcell power transistor in a DMOS portion of the semiconductor device 500. The signal processing circuit 506 includes transistors of another technology, e.g., CMOS transistors, low-voltage FETs, lateral high-voltage FETs and/or bipolar transistors in a further portion, e.g., a CMOS portion. The signal processing circuit 506 may provide overvoltage protection, ESD protection, current limitation, overload protection and/or short-circuit protection, by way of example. Other embodiments refer to smart high-side switches.

Figure 6B:
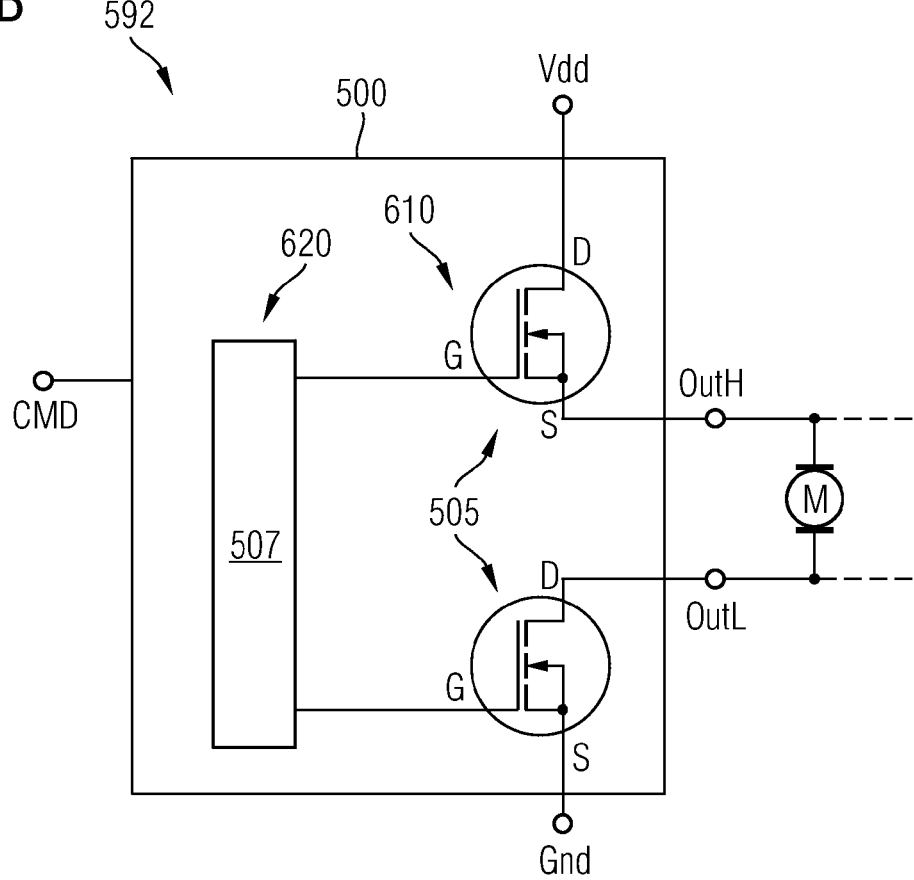
FIG. 6B is a schematic circuit diagram of an electronic circuit including a half-bridge circuit according to a further embodiment.

In the electronic circuit 592 of FIG. 6B the semiconductor device 500 is a monolithically integrated half-bridge circuit and includes two power FETs 505 and a signal processing circuit 506. The source of the high-side switch is connected to a high-side output terminal OutH and the drain of the low-side switch is connected to a low-side output terminal OutL. A motor winding may be electrically arranged between the high-side output terminal OutH and the low-side output terminal OutL. The signal processing circuit 506 may provide pulse width modulation, gate driving, overvoltage protection, ESD protection, current limitation, overload protection and/or short-circuit protection, by way of example.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, the method comprising:
    filling a first trench and a second trench, which extend from a main surface into a semiconductor layer, with a first fill material and selectively recessing the first fill material in the first trench;
    forming a mask covering the second trench and exposing the first trench;
    implanting an oxidation rate promoting material into an exposed first section of the recessed fill material in the first trench; and
    thermally oxidizing, after removing the mask, the first fill material, wherein on the first section an oxidation rate is at least twice as high as on non-implanted sections of the first fill material.

2. The method of claim 1, further comprising:
    forming, by thermal oxidation and before forming the mask, a field dielectric layer lining the first and second trenches and covering the first surface.

3. The method of claim 2, further comprising:
    removing a section of the field dielectric layer exposed by the mask.

4. The method of claim 3, further comprising:
    a cleaning etch using a buffered aqueous solution of hydrogen fluoride, the cleaning etching being performed after removing a section of the field dielectric layer and before oxidizing the recessed first fill material.

5. The method of claim 2, further comprising:
    implanting, before forming the mask, an oxide damaging material into the field dielectric layer, wherein the oxide damaging material does not affect oxide growth on the first fill material.

6. The method of claim 5, wherein
    the oxide damaging material comprises argon atoms.

7. The method of claim 1, wherein
a gate dielectric is formed on exposed sidewall portions of the first trench during thermally oxidizing the recessed first fill material in the first trench.

8. The method of claim 1, further comprising:
depositing and recessing, after thermally oxidizing the recessed first fill material, a second fill material in the first trench.

9. The method of claim 8, further comprising:
forming, after recessing the second fill material, gate electrodes of signal processing circuits in a logic area outside a cell area that comprises the first and second trenches.

10. The method of claim 1, wherein
a plurality of the first and second trenches are formed, respectively.

11. The method of claim 10, wherein
the first trenches are central portions of stripe-shaped trenches and end portions of the stripe-shaped trenches are second trenches.

12. The method of claim 10, further comprising:
forming, in mesa sections of the semiconductor layer between neighboring first trenches, source zones adjoining the main surface and body zones forming first pn junctions with the source zones.

13. The method of claim 1, wherein
thermally oxidizing the first fill material forms a thin separation oxide of grown silicon oxide on the non-implanted sections of the first fill material in the second trench and a thick separation oxide of grown silicon oxide on the implanted first section of the first fill material in the first trench, wherein a vertical extension of the thin separation oxide is smaller than a vertical extension of the thick separation oxide.

14. The method of claim 1, further comprising:
forming, after thermally oxidizing the first fill material an interlayer dielectric on the main surface, wherein the interlayer dielectric has a uniform homogenous or layered configuration in a cell area comprising the first and second trenches.

15. The method of claim 14, wherein
the interlayer dielectric is devoid of thermally grown silicon oxide.

* * * * *